(12) United States Patent
Furuta et al.

(10) Patent No.: US 7,482,554 B2
(45) Date of Patent: Jan. 27, 2009

(54) LASER BEAM PROCESSING MACHINE

(75) Inventors: Kenji Furuta, Tokyo (JP); Ryugo Oba, Tokyo (JP)

(73) Assignee: Disco Corporation, Osaka (JP)

( * ) Notice: Subject to any disclaimer, the term of this patent is extended or adjusted under 35 U.S.C. 154(b) by 401 days.

(21) Appl. No.: 11/324,327

(22) Filed: Jan. 4, 2006

(65) Prior Publication Data

US 2006/0148210 A1    Jul. 6, 2006

(30) Foreign Application Priority Data

Jan. 5, 2005    (JP) .............................. 2005-000822

(51) Int. Cl.
*B23K 26/06* (2006.01)
*B23K 26/38* (2006.01)
*H01L 21/78* (2006.01)

(52) U.S. Cl. ............................ 219/121.73; 219/121.67; 219/121.75

(58) Field of Classification Search ............ 219/121.67, 219/121.73, 121.75, 121.77
See application file for complete search history.

(56) References Cited

FOREIGN PATENT DOCUMENTS

| | | | | |
|---|---|---|---|---|
| GB | 2220502 A | * | 10/1990 | |
| JP | 60-1916890 A | * | 9/1985 | |
| JP | 7-214361 A | * | 8/1995 | |
| JP | 2001-079679 A | * | 3/2001 | |
| JP | 2003-48095 A | * | 2/2003 | |
| JP | 2003-320466 | | 11/2003 | |

* cited by examiner

*Primary Examiner*—Geoffrey S Evans
(74) *Attorney, Agent, or Firm*—Smith, Gambrell & Russell, LLP

(57) ABSTRACT

A laser beam processing machine including a chuck table for holding a workpiece, a laser beam application device for applying a laser beam to the workpiece held on the chuck table, and a processing-feed mechanism for moving the chuck table and the laser beam application device relative to each other. The condenser of the laser beam application device includes a first prism for dividing the laser beam oscillated from the laser beam oscillation mechanism into a first laser beam and a second laser beam, and a second prism for correcting optical paths of the first laser beam and the second laser beam so they become parallel to each other. An image forming lens forms respective spots of the first laser beam and the second laser beam whose optical paths have been corrected to be parallel to each other by the second prism, into images of spots having linear portions on the outer sides and arcuate portions on the inner sides.

4 Claims, 10 Drawing Sheets

(a)

(b)

LASER BEAM PROCESSING MACHINE

FIELD OF THE INVENTION

The present invention relates to a laser beam processing machine for forming grooves by applying a laser beam along streets formed on the front surface of a workpiece such as a semiconductor wafer or the like.

DESCRIPTION OF THE PRIOR ART

As is known to people of ordinary skill in the art, a semiconductor wafer having a plurality of semiconductor chips such as IC's or LSI's, which are formed in a matrix on the front surface of a semiconductor substrate such as a silicon substrate or the like and composed of a laminate consisting of an insulating film and a functional film, is formed in the production process of a semiconductor device. The thus-formed semiconductor chips are sectioned by dividing lines called "streets" in this semiconductor wafer, and individual semiconductor chips are manufactured by dividing the semiconductor wafer along the above streets.

Dividing along the streets of the above semiconductor wafer is generally carried out by using a cutting machine called "dicer". This cutting machine has a chuck table for holding a semiconductor wafer as a workpiece, a cutting means for cutting the semiconductor wafer held on the chuck table, and a moving means for moving the chuck table and the cutting means relative to each other. The cutting means comprises a rotary spindle that is rotated at a high speed and a cutting blade mounted on the spindle. The cutting blade comprises a disk-like base and an annular cutting edge that is mounted on the side wall outer peripheral portion of the base and formed by fixing diamond abrasive grains having a diameter of about 3 µm to the base by electroforming.

To improve the throughput of a semiconductor chip such as IC or LSI, a semiconductor wafer comprising semiconductor chips which are composed of a laminate consisting of a low-dielectric insulating film (Low-k film) formed of a film of an inorganic material such as SiOF or BSG (SiOB) or a film of an organic material such as a polyimide-based and parylene-based polymer and a functional film for forming circuits on the front surface of a semiconductor substrate such as a silicon substrate or the like has recently been implemented.

Further, a semiconductor wafer having a metal pattern called "test element group (TEG)", which is partially formed on the streets of the semiconductor wafer, to test the function of each circuit-through the metal pattern before it is divided has also been implemented.

Because of a difference in the material of the above Low-k film or test element group (TEG) from that of the wafer, it is difficult to cut the wafer together with them at the same time with the cutting blade. That is, as the Low-k film is extremely fragile like mica, when the above semiconductor wafer having a Low-k film laminated thereon is cut along the streets with the cutting blade, a problem arises that the Low-k film peels off and this peeling reaches the circuits, thereby causing a fatal damage to the semiconductor chips. Also, since the test element group (TEG) is made of a metal, a problem occurs that a burr is produced when the semiconductor wafer having the test element group (TEG) is cut with the cutting blade.

To solve the above problems, a processing machine for applying a pulse laser beam along the streets of the semiconductor wafer to remove the Low-k film forming the streets and the test element group (TEG) formed on the streets and then, positioning the cutting blade in the removed areas where the Low-k film or TEG has been removed, to cut the semiconductor wafer is disclosed by JP-A 2003-320466.

Since the laser beam applied through the condenser of a laser beam application means has a Gaussian distribution, however, the sectional forms of two grooves G and G formed along the streets in the laminate V formed on the front surface of the semiconductor wafer W are inverted triangles, as shown in FIG. 16. Therefore, the center portions of the grooves G and G reach the substrate B of the semiconductor wafer W to remove the laminate V, whereas the side portions of the grooves G and G do not reach the substrate B and hence, the laminate V remains. As a result, there is a problem that when the semiconductor wafer W is cut along the grooves G and G with the cutting blade T and the laminate V is cut with the cutting blade T, the remaining laminate V peels off and damages the circuits C. Further, there is another problem that at the time when the grooves G and G are formed, debris are scattered to the both sides of each street S due to the Gaussian distribution of the laser beam and adheres to the circuits C. When the laminate V is removed excessively so as to prevent the influence of peeling by cutting with the cutting blade T, another problem may occur that the grooves G and G are formed across the street S, thereby damaging the circuits C.

SUMMARY OF THE INVENTION

It is an object of the present invention to provide a laser beam processing machine capable of forming grooves such that their outer side walls become perpendicular to the processing surface of a workpiece.

To attain the above object, according to the present invention, there is provided a laser beam processing machine comprising a chuck table for holding a workpiece, a laser beam application means for applying a laser beam to the workpiece held on the chuck table, and a processing-feed means for moving the chuck table and the laser beam application means relative to each other, the laser beam application means including a laser beam oscillation means and a condenser for converging a laser beam oscillated from the laser beam oscillation means and applying the converged laser beam, wherein the condenser comprises a first prism for dividing the laser beam oscillated from the laser beam oscillation means into a first laser beam and a second laser beam both having a semi-circular section and interchanging the first laser beam and the second laser beam, a second prism for correcting the optical paths of the first laser beam and the second laser beam formed through the first prism so as to become parallel each other, and an image forming lens for forming respective spots of the first laser beam and the second laser beam whose optical paths have been corrected to be parallel each other by the second prism, into images of spots having linear portions on the outer sides and arcuate portions on the inner sides.

The interval between the spots of the first laser beam and the second laser beam formed by the image forming lens is controlled by adjusting the interval between the first prism and the second prism. Further, a relay lens is interposed between the second prism and the image forming lens, and the back-focus position of the relay lens is set to the apex position of the first prism. Preferably, a mask member for changing a laser beam having a circular section oscillated from the laser beam oscillation means into a laser beam having a substantially rectangular section is interposed between the laser beam oscillation means and the first prism.

According to the laser beam processing machine of the present invention, a laser beam oscillated from the laser beam oscillation means is divided into a first laser beam and a second laser beam and the first laser beam and the second laser beam are interchanged by the first prism, and after the optical paths of the first laser beam and the second laser beam are corrected to become parallel each other by the second prism, the first laser beam and the second laser beam form images of spots having linear portions on the outer sides and arcuate portions on the inner sides by the image forming lens. Therefore, by carrying out laser processing with the formed spots of the first laser beam and the second laser beam, a first groove and a second groove whose outer side walls are perpendicular to the processing surface of the workpiece can be formed.

In the laser beam processing machine of the present invention, two grooves can be formed by the first laser beam and the second laser beam formed through the first prism at the same time, thereby improving productivity.

Further, in the laser beam processing machine of the present invention, the first laser beam and the second laser beam applied to the workpiece form each an image of spot having a linear portion on the outer side and arcuate portion on the inner side by the image forming lens. Therefore, debris are not scattered to the circuit C sides during laser processing.

DETAILED DESCRIPTION OF THE PREFERRED EMBODIMENTS

Preferred embodiments of the laser beam processing machine constituted according to the present invention will be described in detail hereinunder with reference to the accompanying drawings.

Figure 1:
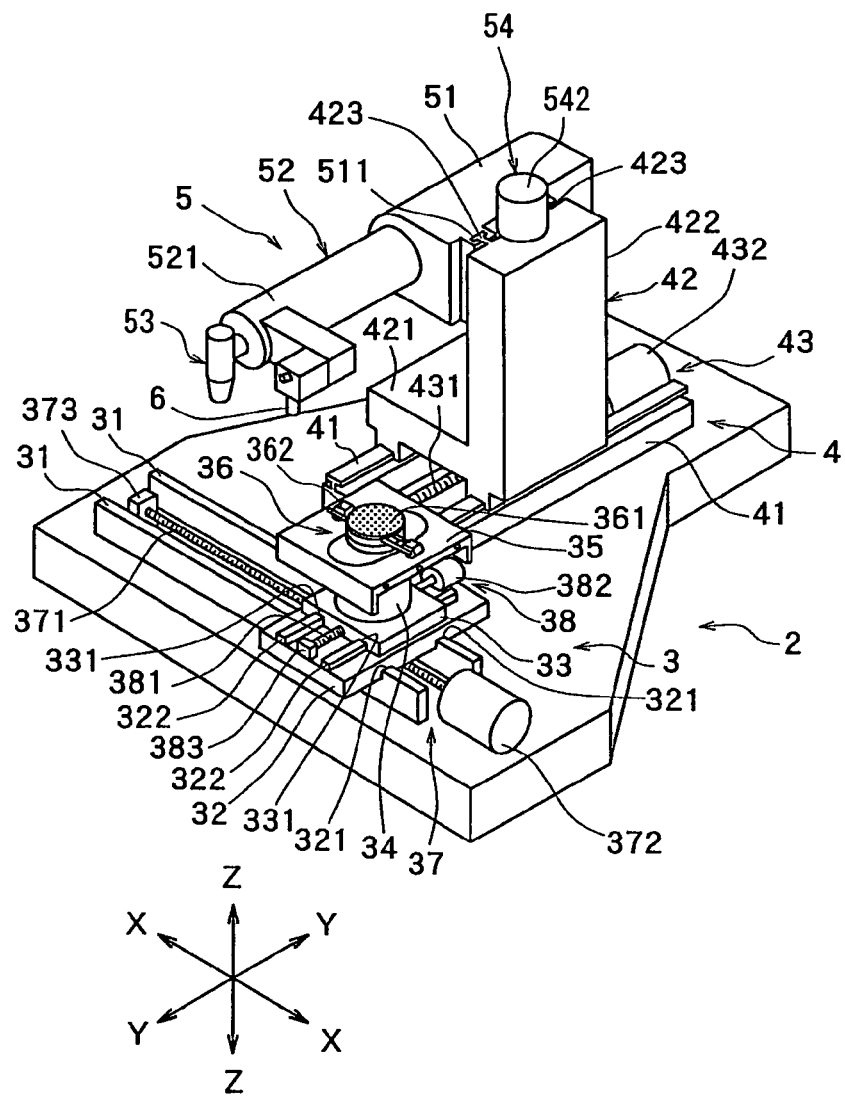
FIG. 1 is a perspective view of a laser beam processing machine constituted according to the present invention.

FIG. 1 is a perspective view of a laser beam processing machine constituted according to the present invention. The laser beam processing machine shown in FIG. 1 comprises a stationary base 2, a chuck table mechanism 3 for holding a workpiece, which is mounted on the stationary base 2 in such a manner that it can move in a processing-feed direction indicated by an arrow X, a laser beam application unit support mechanism 4 mounted on the stationary base 2 in such a manner that it can move in an indexing direction indicated by an arrow Y perpendicular to the direction indicated by the arrow X, and a laser beam application unit 5 mounted on the laser beam application unit support mechanism 4 in such a manner that it can move in a focal point position adjusting direction indicated by an arrow Z.

The above chuck table mechanism 3 comprises a pair of guide rails 31 and 31 that are mounted on the stationary base 2 and arranged parallel to each other in the direction indicated by the arrow X, a first sliding block 32 mounted on the guide rails 31 and 31 in such a manner that it can move in the direction indicated by the arrow X, a second sliding block 33 mounted on the first sliding block 32 in such a manner that it can move in the direction indicated by the arrow Y, a support table 35 supported on the second sliding block 33 by a cylindrical member 34, and a chuck table 36 as a workpiece holding means. This chuck table 36 has a workpiece holding surface 361 made of a porous material so that a plate-like workpiece such as a disk-like semiconductor wafer is held on the chuck table 36 by a suction means that is not shown. The chuck table 36 is rotated by a pulse motor (not shown) installed in the cylindrical member 34. The chuck table 36 is provided with clamps 362 for fixing an annular frame for supporting the semiconductor wafer, which will be described later.

The above first sliding block 32 has, on the undersurface, a pair of to-be-guided grooves 321 and 321 to be fitted to the above pair of guide rails 31 and 31 and, on the top surface, a pair of guide rails 322 and 322 formed parallel to each other in the direction indicated by the arrow Y. The first sliding block 32 constituted as described above can move in the direction indicated by the arrow X along the pair of guide rails 31 and 31 by fitting the to-be-guided grooves 321 and 321 to the pair of guide rails 31 and 31, respectively. The chuck table mechanism 3 in the illustrated embodiment comprises a processing-feed means (mechanism) 37 for moving the first sliding block 32 along the pair of guide rails 31 and 31 in the direction indicated by the arrow X. The processing-feed means 37 comprises a male screw rod 371 that is arranged between the above pair of guide rails 31 and 31 in parallel to them and a drive source such as a pulse motor 372 for rotary-driving the male screw rod 371. The male screw rod 371 is, at its one end, rotatably supported to a bearing block 373 fixed on the above stationary base 2 and is, at the other end, transmission-coupled to the output shaft of the above pulse motor 372 by a speed reducer that is not shown. The male screw rod 371 is screwed into a threaded through-hole formed in a female screw block (not shown) projecting from the undersurface of the center portion of the first sliding block 32. Therefore, by driving the male screw rod 371 in a normal direction or reverse direction with the pulse motor 372, the first sliding block 32 is moved along the guide rails 31 and 31 in the processing-feed direction indicated by the arrow X.

The above second sliding block 33 has, on the undersurface, a pair of to-be-guided grooves 331 and 331 to be fitted to the pair of guide rails 322 and 322 on the top surface of the above first sliding block 32 and can move in the direction indicated by the arrow Y by fitting the to-be-guided grooves 331 and 331 to the pair of guide rails 322 and 322, respectively. The chuck table mechanism 3 in the illustrated embodiment comprises a first indexing-feed means 38 for moving the second sliding block 33 in the direction indicated by the arrow Y along the pair of guide rails 322 and 322 provided on the first sliding block 32. The first indexing-feed means 38 comprises a male screw rod 381, which is arranged between the above pair of guide rails 322 and 322 in parallel to them and a drive source such as a pulse motor 382 for rotary-driving the male screw rod 381. The male screw rod 381 is, at its one end, rotatably supported to a bearing block 383 fixed on the top surface of the above first sliding block 32 and is, at the other end, transmission-coupled to the output shaft of the above pulse motor 382 by a speed reducer that is not shown. The male screw rod 381 is screwed into a threaded through-hole formed in a female screw block (not shown) projecting from the undersurface of the center portion of the second sliding block 33. Therefore, by driving the male screw rod 381 in a normal direction or reverse direction with the pulse motor 382, the second sliding block 33 is moved along the guide rails 322 and 322 in the indexing-feed direction indicated by the arrow Y.

The above laser beam application unit support mechanism 4 comprises a pair of guide rails 41 and 41 mounted on the stationary base 2 and arranged parallel to each other in the direction indicated by the arrow Y and a movable support base 42 mounted on the guide rails 41 and 41 in such a manner that it can move in the direction indicated by the arrow Y. This movable support base 42 comprises a movable support portion 421 movably mounted on the guide rails 41 and 41 and a mounting portion 422 mounted on the movable support portion 421. The mounting portion 422 is provided with a pair of guide rails 423 and 423 extending in parallel in the direction indicated by the arrow Z on one of its flanks. The laser beam application unit support mechanism 4 in the illustrated embodiment comprises a second indexing-feed means 43 for moving the movable support base 42 along the pair of guide rails 41 and 41 in the direction indicated by the arrow Y. This second indexing-feed means 43 comprises a male screw rod 431 arranged between the above pair of guide rails 41 and 41 in parallel to them, and a drive source such as a pulse motor 432 for rotary-driving the male screw rod 431. The male screw rod 431 is, at its one end, rotatably supported to a bearing block (not shown) fixed on the above stationary base 2 and is, at the other end, transmission-coupled to the output shaft of the above pulse motor 432 by a speed reducer that is not shown. The male screw rod 431 is screwed into a threaded through-hole formed in a female screw block (not shown) projecting from the undersurface of the center portion of the movable support portion 421 constituting the movable support base 42. Therefore, by driving the male screw rod 431 in a normal direction or reverse direction with the pulse motor 432, the movable support base 42 is moved along the guide rails 41 and 41 in the indexing-feed direction indicated by the arrow Y.

The laser beam application unit 5 in the illustrated embodiment comprises a unit holder 51 and a laser beam application means 52 secured to the unit holder 51. The unit holder 51 has a pair of to-be-guided grooves 511 and 511 to be slidably fitted to the pair of guide rails 423 and 423 on the above mounting portion 422 and is supported in such a manner that it can move in the direction indicated by the arrow Z by fitting the to-be-guided grooves 511 and 511 to the above guide rails 423 and 423, respectively.

Figure 2:
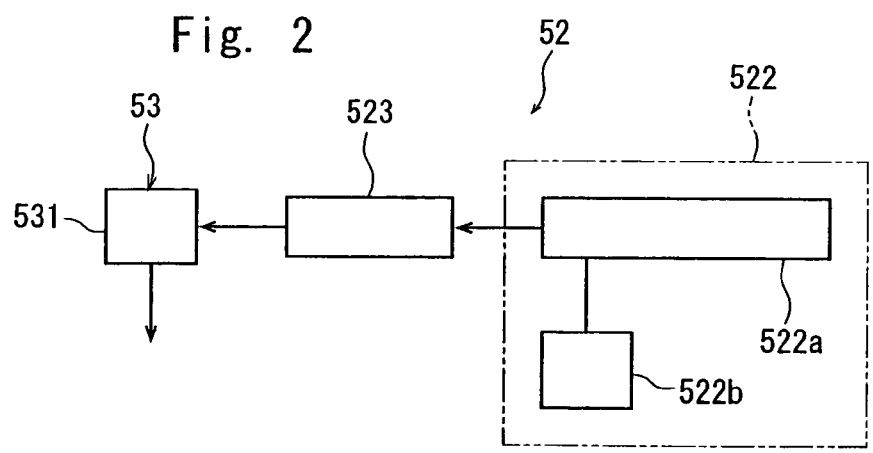
FIG. 2 is a block diagram schematically showing the constitution of a laser beam application means provided in the laser beam processing machine shown in FIG. 1.

The illustrated laser beam application means 52 comprises a cylindrical casing 521 secured to the above unit holder 51 and extending substantially horizontally. In the casing 521, there are installed a pulse laser beam oscillation means 522 and a transmission optical system 523 as shown in FIG. 2. The pulse laser beam oscillation means 522 comprises a pulse laser beam oscillator 522a composed of a YAG laser oscillator or YVO4 laser oscillator and a repetition frequency setting means 522b connected to the pulse laser beam oscillator 522a. The transmission optical system 523 comprises suitable optical elements such as a beam splitter, etc. A condenser 53 for converging a laser beam that is oscillated from the above laser beam oscillation means 522 and transmitted through the optical transmission system 523 is attached to the end of the above casing 521.

A first embodiment of the condenser 53 will be described with reference to FIG. 3.

Figure 3:
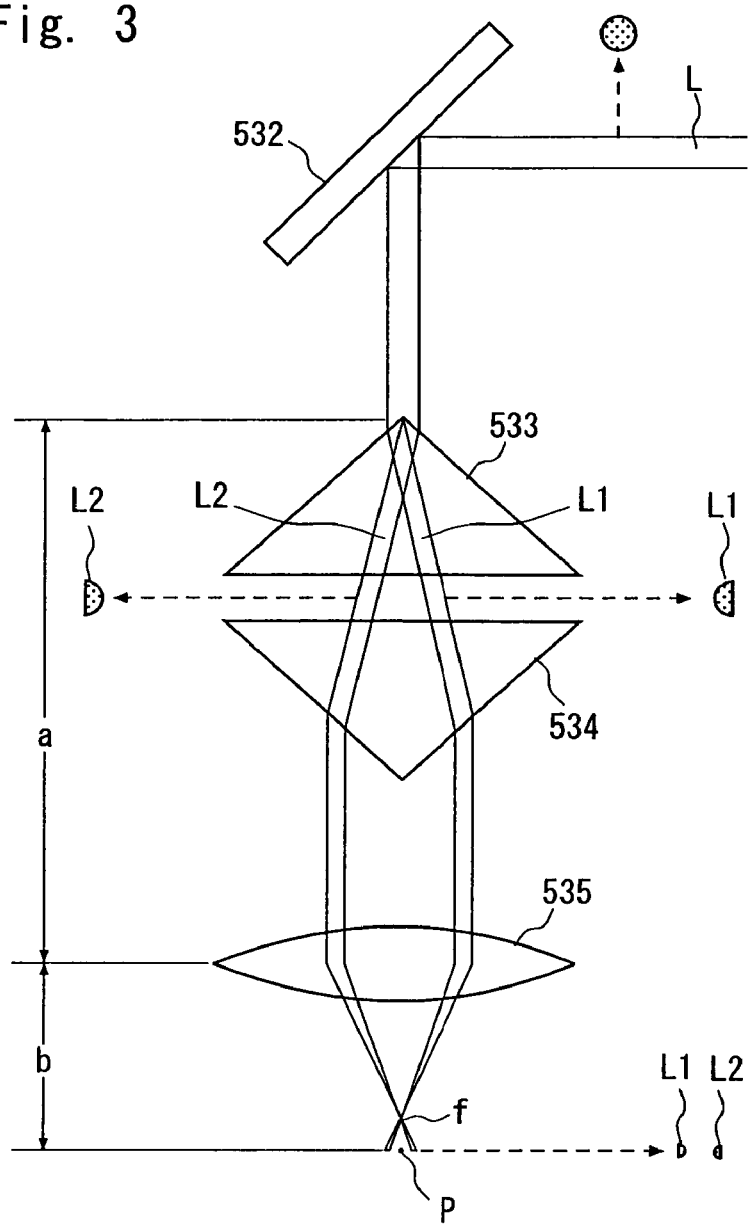
FIG. 3 is an explanatory diagram of a first embodiment of a condenser provided in the laser beam processing machine shown in FIG. 1.

The condenser 53 shown in FIG. 3 comprises a deflecting mirror 532, a first prism 533, a second prism 534 and an image forming lens 535 all of which are installed in a case 531 (see FIG. 2). The deflecting mirror 532 deflects a laser beam L, which is oscillated from the above pulse laser beam oscillation means 522 (see FIG. 2) and irradiated through the transmission optical system 523, downward, that is, toward the first prism 533 as shown in FIG. 3. The first prism 533 divides the laser beam L oscillated from the pulse laser beam oscillation means 522 into a first laser beam L1 and a second laser beam L2 both having a semicircular section and interchanges the first laser beam L1 and the second laser beam L2 from side to side. The second prism 534 corrects the optical paths of the first laser beam L1 and the second laser beam L2 formed by the first prism 533 to become parallel to each other. The image forming lens 535 provides images of the spots of the first laser beam L1 and the second laser beam L2 whose optical paths have been corrected by the second prism 534.

The condenser 53 shown in FIG. 3 is constituted as described above, and its function will be described hereinunder. The laser beam L having a circular section, which is oscillated from the above pulse laser beam oscillation means 522 and irradiated through the transmission optical system 523, is deflected toward the first prism 533 by the deflecting mirror 532. The laser beam L having a circular section, which has reached the first prism 533, is divided into the first laser beam L1 and the second laser beam L2 both having a semicircular section by the first prism 533, and the first laser beam L1 and the second laser beam L2 are interchanged by the first prism 533. As a result, arcuate portions are located on the inner sides and linear portions are located on the outer sides of the spots of the first laser beam L1 and the second laser beam L2. The optical paths of the first laser beam L1 and the second laser beam L2 thus divided are corrected to become parallel to each other after they pass through the second prism 534. The first laser beam L1 and the second laser beam L2 whose optical paths have been corrected to become parallel to each other by the second prism 534 are formed at a predetermined image forming position "P" after they pass through the image forming lens 535. Since the image forming position "P" is located on the downstream side of the focal point "f" of the image forming lens 535 at this point, the first laser beam L1 and the second laser beam L2 are reversed from side to side to form images of spots having linear portions on the outer sides and arcuate portions on the inner sides.

Figure 4:
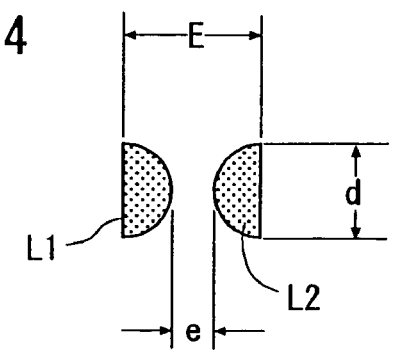
FIG. 4 is an enlarged explanatory view showing shapes of the spots, which are formed by the condenser shown in FIG. 3, of a first laser beam and a second laser beam.
Figure 5:
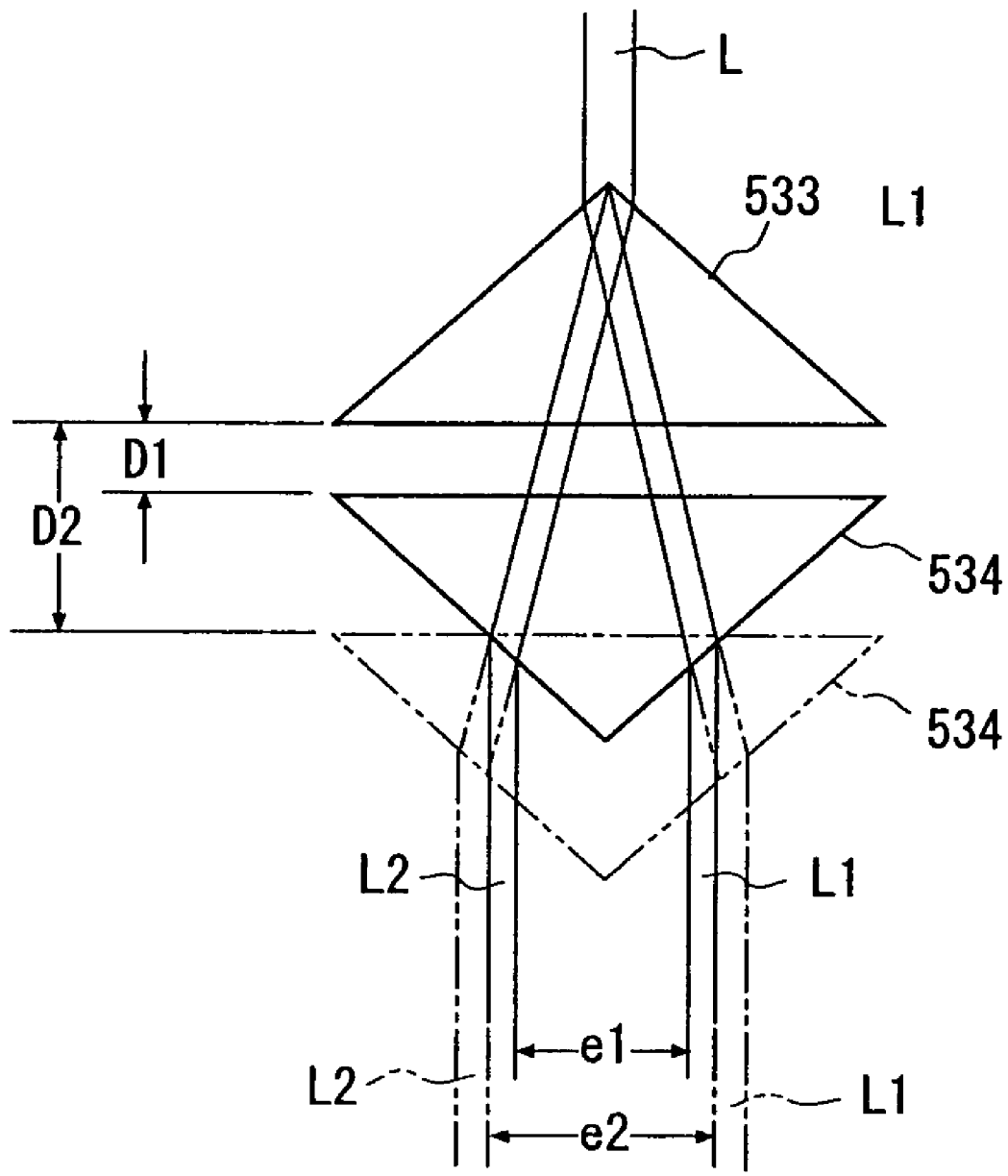
FIG. 5 is an explanatory diagram showing a state where the interval between the first laser beam and the second laser beam is changed by varying the interval between a first prism and a second prism constituting the condenser shown in FIG. 3.

When the distance between the apex of the first prism and the image forming lens 535 is represented by "a", the distance between the image forming lens 535 and the image forming position "P" is represented by "b", and the focal distance of the image forming lens 535 is represented by "f" in FIG. 3, the equation $(1/a+1/b=1/f)$ is established. As shown in FIG. 4, the spot sizes "d" of the first laser beam L1 and the second laser beam L2 are determined by magnification $(m=b/a)$. Further, the width "E" of the spots of the first laser beam L1 and the second laser beam L2, that is, the interval "e" between the spots of the first laser beam L1 and the second laser beam L2 is changed by varying the interval between the first prism 533 and the second prism 534. That is, as shown in FIG. 5, when the interval between the first prism 533 and the second prism 534 is "D1", the interval between the first laser beam L1 and the second laser beam L2 passing through the second prism 534 becomes "e1". When-the interval between the first prism 533 and the second prism 534 extends to "D2", the interval between the first laser beam L1 and the second laser beam L2 passing through the second prism 534 becomes "e2". Therefore, the interval "e" between the spots of the first laser beam L1 and the second laser beam L2, formed at the predetermined image forming position "P" (see FIG. 3), that is, the width "E" of the spots also changes, when they pass through the image forming lens 535. For instance, when the diameter of the laser beam L incident on the first prism 533 is 1 mm, the magnification "m" is 1/50, and the interval "D1" between the first prism 533 and the second prism 534 is changed from 5 mm to 15 mm, the interval "e" between the spots of the first laser beam L1 and the second laser beam L2 changes in a range of from 0 to 40 μm and therefore, the width "E" of the spots of the first laser beam L1 and the second laser beam L2 changes in a range of from 20 to 60 μm.

A description will be subsequently given of a second embodiment of the condenser 53 with reference to FIG. 6.

Figure 6:
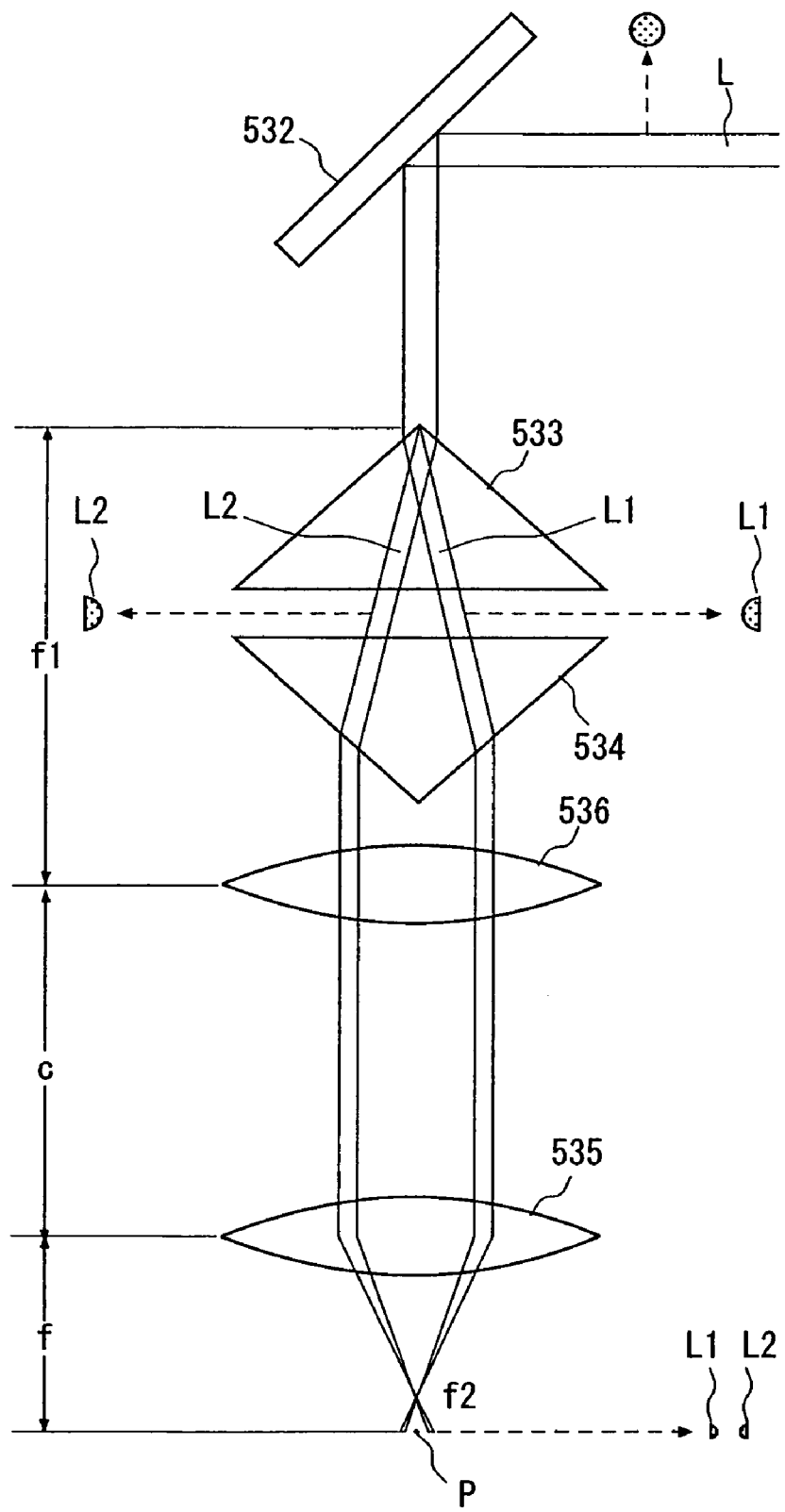
FIG. 6 is an explanatory diagram of a second embodiment of the condenser provided in the laser beam processing machine shown in FIG. 1.

In the condenser 53 shown in FIG. 6, a relay lens 536 is interposed between the second prism 534 and the image forming lens 535 in the first embodiment shown in FIG. 3. Since other constituent members of the condenser 53 shown in FIG. 6 are the same as the constituent members of the first embodiment shown in FIG. 3, the same members are given the same reference symbols and their descriptions are omitted.

In the condenser 53 shown in FIG. 6, the back-focus position "f1" of the relay lens 536 is aligned with the apex of the first prism 533 to form an infinite correction optical system. Therefore, as the interval "c" between the relay lens 536 and the image forming lens 535 can be changed freely, the design freedom is very high. In the condenser 53 shown in FIG. 6, the magnification can be changed freely by a combination of the relay lens 536 and the image forming lens 535. In the condenser 53 shown in FIG. 6, the image forming position "P" of the first laser beam L1 and the second laser beam L2 becomes the focal point "f" of the image forming lens 535. "f2" in FIG. 6 is the focal point obtained by a combination of the relay lens 536 and the image forming lens 535.

A description will be subsequently given of a third embodiment of the condenser 53 with reference to FIG. 7.

Figure 7:
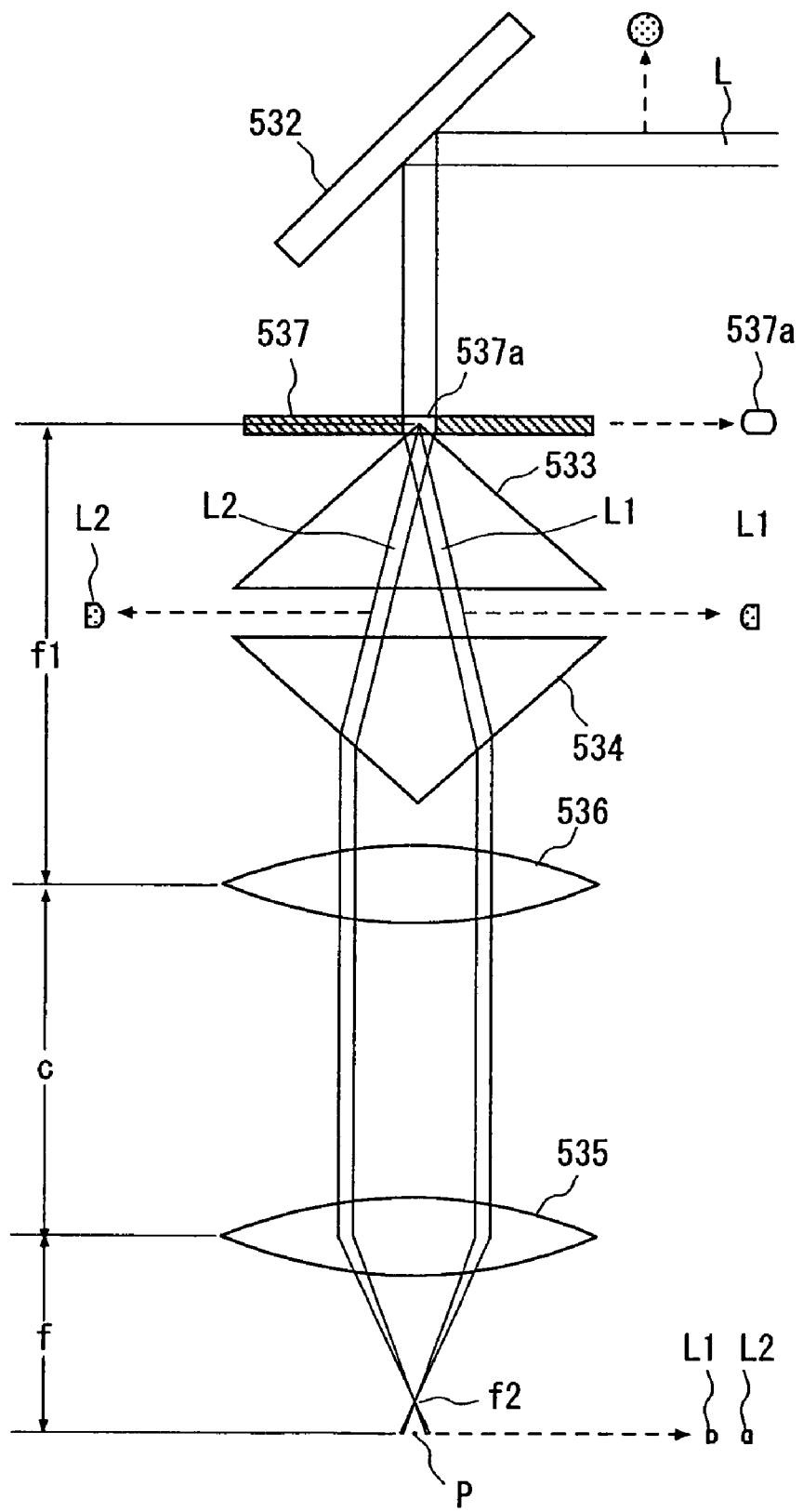
FIG. 7 is an explanatory diagram of a third embodiment of the condenser provided in the laser beam processing machine shown in FIG. 1.

In the condenser 53 shown in FIG. 7., a mask member 637 having a substantially rectangular hole 537a is arranged at the apex of the first prism 533 in the second embodiment shown in FIG. 6. Since other constituent members of the condenser 53 shown in FIG. 7 are the same as the constituent members in the first embodiment shown in FIG. 3, the same members are given the same reference symbols and their descriptions are omitted.

In the condenser 53 shown in FIG. 7, a laser beam L having a circular section, which is oscillated from the above pulse laser beam oscillation means 522 and irradiated through the transmission optical system 523, whose section becomes substantially rectangular after passing through the hole 537a of the mask member 537, reaches the first prism 533. As a result, the first laser beam L1 and the second laser beam L2, which are divided by the first prism 533, have a substantially rectangular section and the spots of the first laser beam L1 and the second laser beam L2 passing through the second prism 534 and the relay lens 536 and form an image by the image forming lens 535 become substantially rectangular. By cutting the Gaussian distribution weak portions of the laser beam L having a circular section by the mask member 537, it is possible to make sharp processing with the low energy sides of the laser beam at the processing point.

Returning to FIG. 1, an image pick-up means 6 for detecting the area to be processed by the above laser beam application means 52 is mounted on the front end of the casing 521 constituting the above laser beam application means 52. This image pick-up means 6 comprises an infrared illuminating means for applying infrared radiation to the workpiece, an optical system for capturing infrared radiation applied by the infrared illuminating means, and an image pick-up device (infrared CCD) for outputting an electric signal corresponding to infrared radiation captured by the optical system, in addition to an ordinary image pick-up device (CCD) for picking up an image with visible radiation in the illustrated embodiment. An image signal is transmitted to a control means that is not shown.

The laser beam application unit 5 in the illustrated embodiment has a moving means 54 for moving the unit holder 51 along the pair of guide rails 423 and 423 in the direction indicated by the arrow Z. The moving means 53 comprises a male screw rod (not shown) arranged between the pair of guide rails 423 and 423 and a drive source such as a pulse motor 542 for rotary-driving the male screw rod. By driving the male-screw rod (not shown) in a normal direction or reverse direction with the pulse motor 542, the unit holder 51 and the laser beam application means 52 are moved along the guide rails 423 and 423 in the direction indicated by the arrow Z. In the illustrated embodiment, the laser beam application means 52 is moved up by driving the pulse motor 542 in a normal direction and moved down by driving the pulse motor 542 in a reverse direction.

The laser beam processing machine in the illustrated embodiment is constituted as described above, and its function will be described hereinbelow.

The semiconductor wafer as a workpiece to be processed by the above laser beam processing machine will be described with reference to FIG. 8 and FIG. 9.

Figure 8:
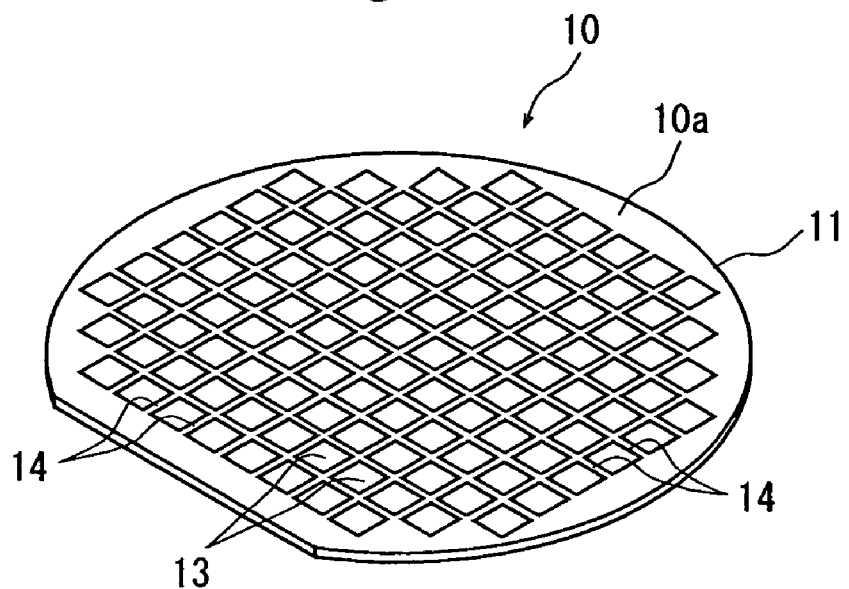
FIG. 8 is a perspective view of a semiconductor wafer as a workpiece.
Figure 9:
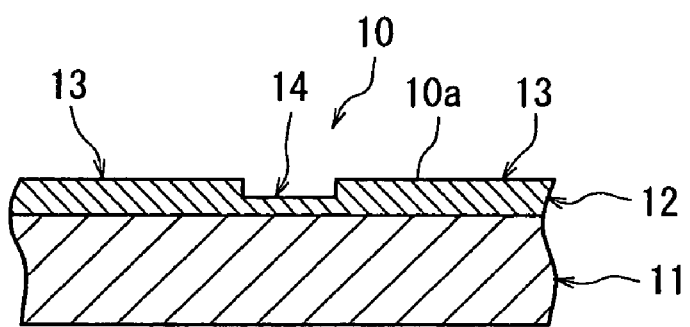
FIG. 9 is a partially enlarged sectional view of the semiconductor wafer shown in FIG. 8.

In the semiconductor wafer 10 shown in FIG. 8 and FIG. 9, a plurality of semiconductor chips 13 (devices) such as IC's or LSI's that are composed of a laminate 12 consisting of an insulating film and a functional film for forming circuits, are formed in a matrix on the front surface of a semiconductor substrate 11 such as a silicon substrate or the like. The semiconductor chips 13 are sectioned by streets 14 formed in a lattice pattern. In the illustrated embodiment, the insulating film for forming the laminate 12 is an $SiO_2$ film or a low-dielectric insulating film (Low-k film) formed of a film of an inorganic material such as SiOF or BSG (SiOB) or a film of an organic material such as a polyimide-based and parylene-based polymer.

Figure 10:
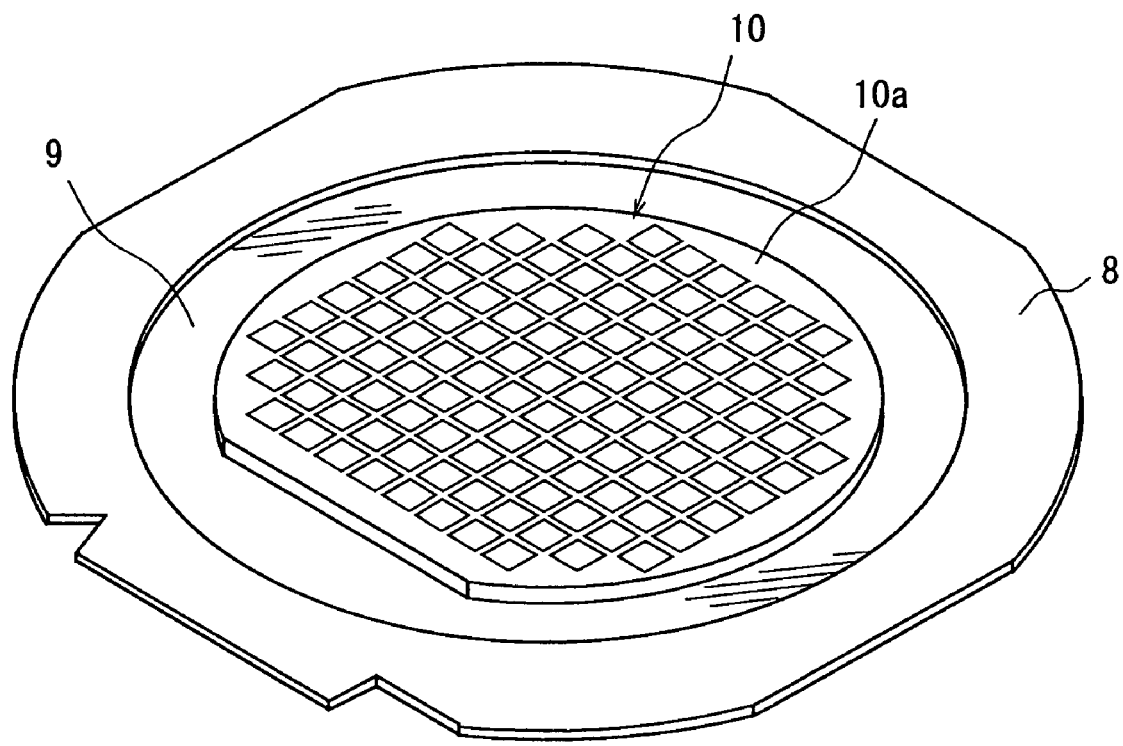
FIG. 10 is a perspective view showing a state where the semiconductor wafer shown in FIG. 8 is supported on an annular frame through a protective tape.

To divide the above-described semiconductor wafer 10 along the streets 14, the semiconductor wafer 10 is put on the surface of a protective tape 9 mounted on an annular frame 8, as shown in FIG. 10. At this point, the back surface of the semiconductor wafer 10 is put on the protective tape 9 in such manner that the front surface 10a faces up.

Next comes the laser beam application step for applying a laser beam along the streets 14 of the semiconductor wafer 10 to remove the laminate 12 on the streets 14.

In this laser beam application step, the semiconductor wafer 10 supported on the annular frame 8 through the protective tape 9 is first placed on the chuck table 36 of the laser beam processing machine shown in FIG. 1, and suction-held on the chuck table 36. At this point, the semiconductor wafer 10 is held in such a manner that the front surface 10a faces up. The annular frame 8 supporting the semiconductor wafer 10 through the protective tape 9 is fixed by the clamps 362.

The chuck table 36 suction-holding the semiconductor wafer 10 as described above is brought to a position right below the image pick-up means 6 by the processing-feed means 37. After the chuck table 36 is positioned right below the image pick-up means 6, alignment work for detecting the area to be processed of the semiconductor wafer 10 is carried out by the image pick-up means 6 and the control means that is not shown. That is, the image pick-up means 6 and the control means (not shown) carry out image processing such as pattern matching, etc. to align a street 14 formed in a predetermined direction of the semiconductor wafer 10 with the condenser 53 of the laser beam application means 52 for applying a laser beam along the street 14, thereby performing the alignment of a laser beam application position. The alignment of the laser beam application position is also similarly carried out on streets 14 that are formed on the semiconductor wafer 10 and extend in a direction perpendicular to the above predetermined direction.

Figure 11:
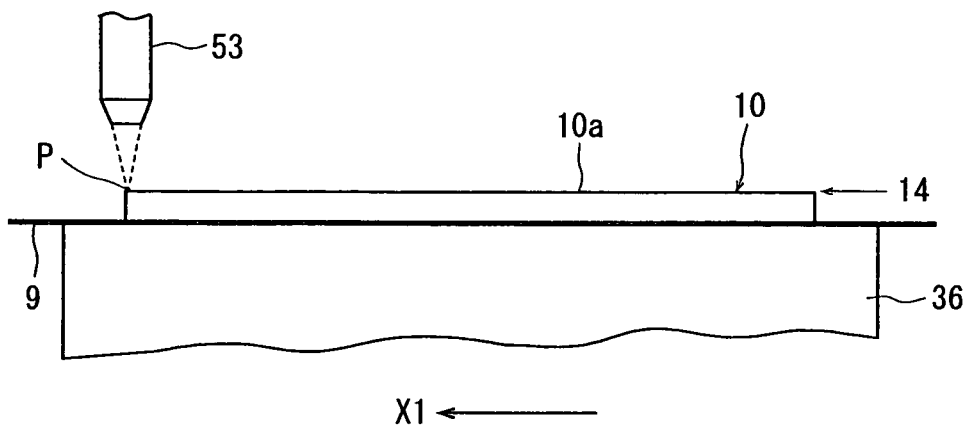
FIGS. 11(a) and 11(b) are explanatory diagrams showing a laser beam application step for forming grooves along a street of the semiconductor wafer shown in FIG. 8 by the laser beam processing machine shown in FIG. 1.
Figure 11:
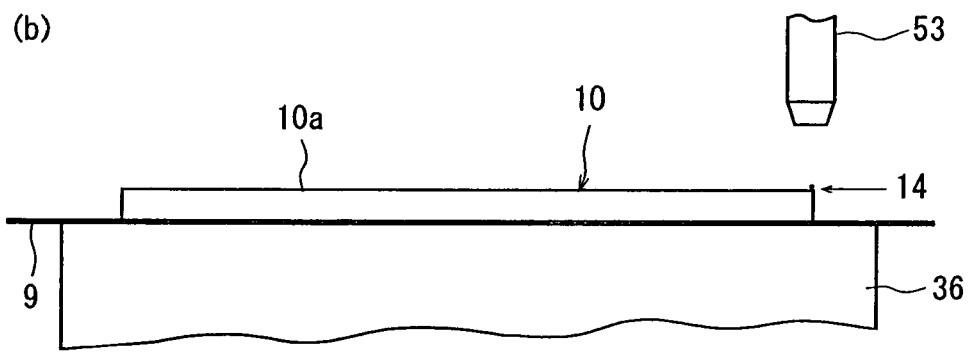

After the street 14 formed on the semiconductor wafer 10 held on the chuck table 36 is detected and the alignment of the laser beam application position is carried out as described above, the chuck table 36 is moved to a laser beam application area where the condenser 53 for applying a laser beam is located so as to bring the predetermined street 14 at a position right below the condenser 53, as shown in FIG. 11(a). At this point, as shown in FIG. 11(a), the semiconductor wafer 10 is positioned such that one end (left end in FIG. 11(a)) of the street 14 is located right below the condenser 53. The moving means 54 is then activated to adjust the height of the laser beam application means 52 so that the image forming position "P" of the above first laser beam L1 and the second laser beam L2 applied from the condenser 53 is located on the surface of the street 14.

The chuck table 36, that is, the semiconductor wafer 10 is then moved in the direction indicated by the arrow X1 in FIG. 11(a) at a predetermined processing-feed rate while the first laser beam L1 and the second laser beam L2 are applied from the condenser 53. When the other end (right end in FIG. 11(b)) of the street 14 reaches a position right below the condenser 53 as shown in FIG. 11(b), the application of the pulse laser beam is suspended and the movement of the chuck table 36, that is, the semiconductor wafer 10 is stopped.

Figure 12:
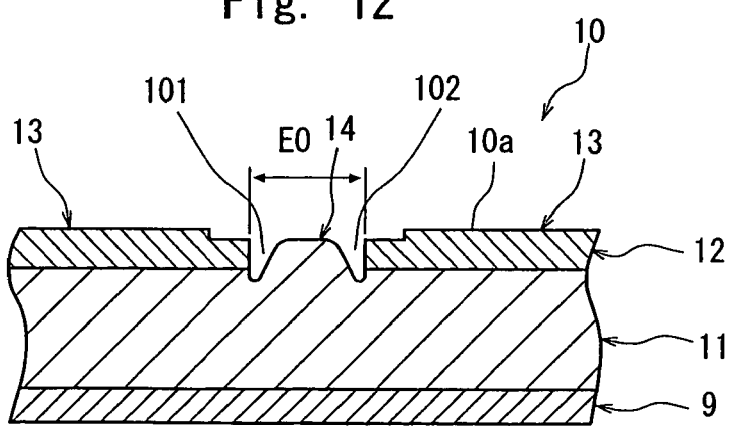
FIG. 12 is an enlarged sectional view of grooves formed in the semiconductor wafer by carrying out the laser beam application step shown in FIGS. 11(a) and 11(b)

As a result, a first groove 101 deeper than the laminate 12 is formed by the first laser bam L1 and a second groove 102 deeper than the laminate 12 is formed by the above second laser beam L2 in the street 14 of the semiconductor wafer 10, as shown in FIG. 12. Thus, two grooves can be formed at the same time by the laser beam processing machine of the present invention, thereby improving productivity. Since the first laser beam L1 and the second laser beam L2 each for forming the first groove 101 and the second groove 102 form an image of spots having linear portions on the outer sides and arcuate portions on the inner sides, the outer side walls of the first groove 101 and the second groove 102 be formed perpendicular to the processing surface (top surface) of the laminate 12. Therefore, even when grooves reaching the substrate 11 are formed to divide the laminate 12, the semiconductor chips 13 (devices) are not affected and debris are not scattered to the semiconductor chips 13 (devices) during laser processing. The length between the outer side of the first groove 101 and that of the second groove 102 formed in the street 14, that is, the width "E0" of the grooves can be suitably controlled by adjusting the interval "D1" between the first prism 533 and the second prism 534 as described above and set larger than the thickness of the cutting blade which will be described later. In the same manner, the above laser beam application step is carried out on all the streets 14 formed on the semiconductor wafer 10.

The processing conditions in the above laser beam application step are set as follows, for example.

Figure 13:
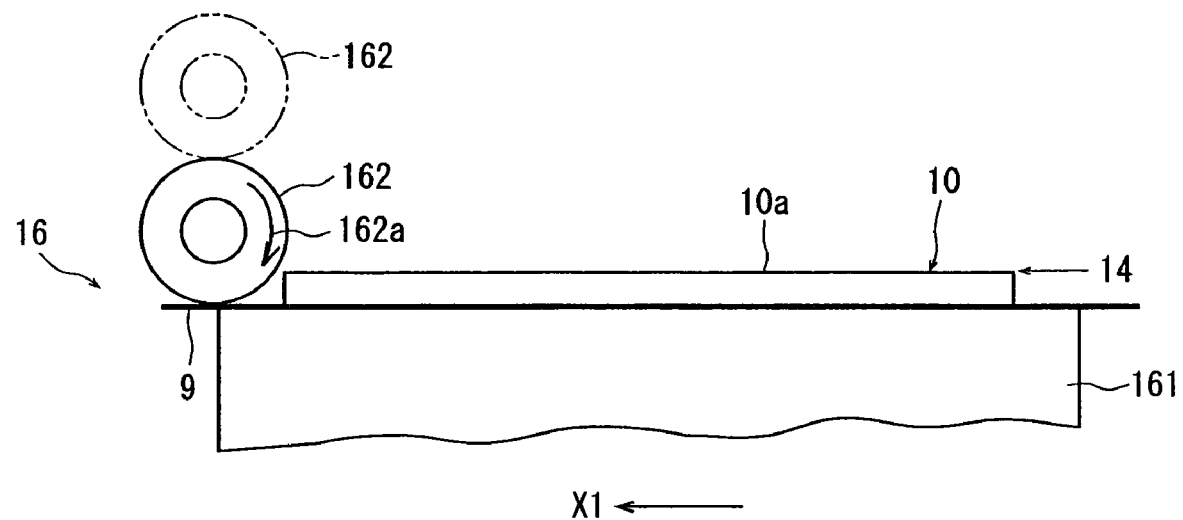
FIG. 13 is an explanatory diagram showing a cutting step for cutting the semiconductor wafer along the grooves formed by the laser beam application step shown in FIGS. 11(a) and 11(b)
Figure 14:
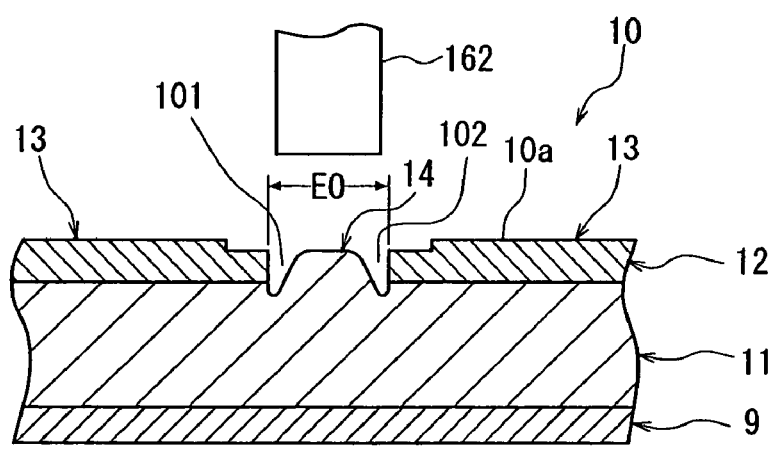
FIG. 14 is an explanatory diagram showing the relationship between the grooves and the cutting blade in the cutting step shown in FIG. 13.

Light source of a laser beam: YVO4 laser or YAG laser
Wavelength: 355 nm
Output: 1.0 W
Repetition frequency: 50 kHz
Pulse width: 10 ns
Feed rate: 100 mm/sec
Street width: 50 μm
Groove width (E0): 30 μm After the above laser beam application step is carried out on all the streets 14 formed on the semiconductor wafer 10, next comes the step of cutting the semiconductor wafer 10 along the streets 14. That is, as shown in FIG. 13, the semiconductor wafer 10 which has been subjected to the above laser beam application step is placed on a chuck table 161 of a cutting machine 16 in such a manner that the front surface 10a faces up, and held on the chuck table 161 by a suction means that is not shown. The chuck table 161 suction-holding the semiconductor wafer 10 is then moved to the cutting start position of the area to be cut. At this point, the semiconductor wafer 10 is positioned such that one end (left end in FIG. 13) of the street 14 to be cut is located on the right side by a predetermined distance from right below a cutting blade 162, as shown in FIG. 13. The cutting blade 162 is positioned within the width "E0" between the first groove 101 formed by the first laser beam L1 and the second groove 102 formed by the second laser beam L2, as shown in FIG. 14.

Figure 15:
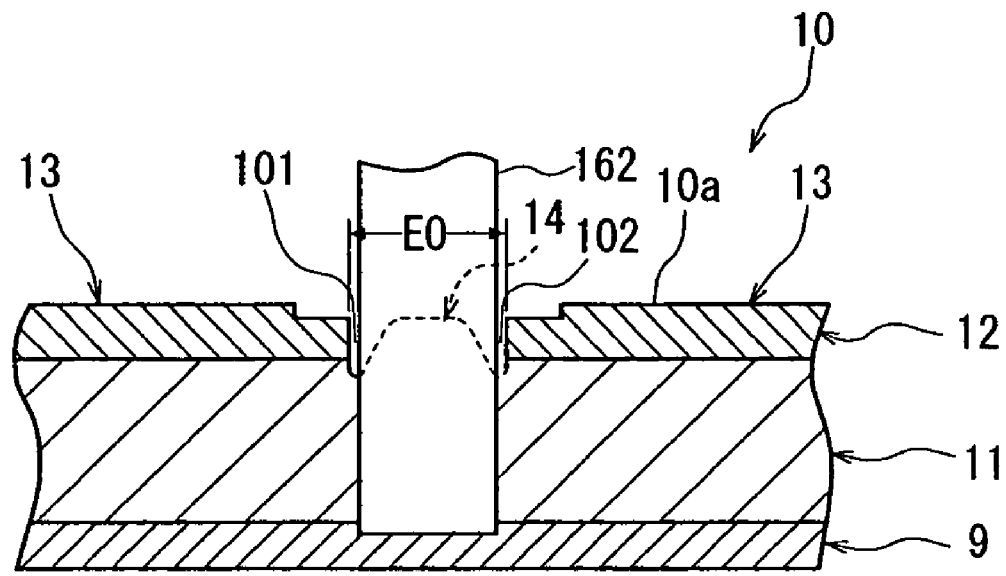
FIG. 15 is an explanatory diagram showing the cutting-in feed position of the cutting blade in the cutting step shown in FIG. 13.
Figure 16:
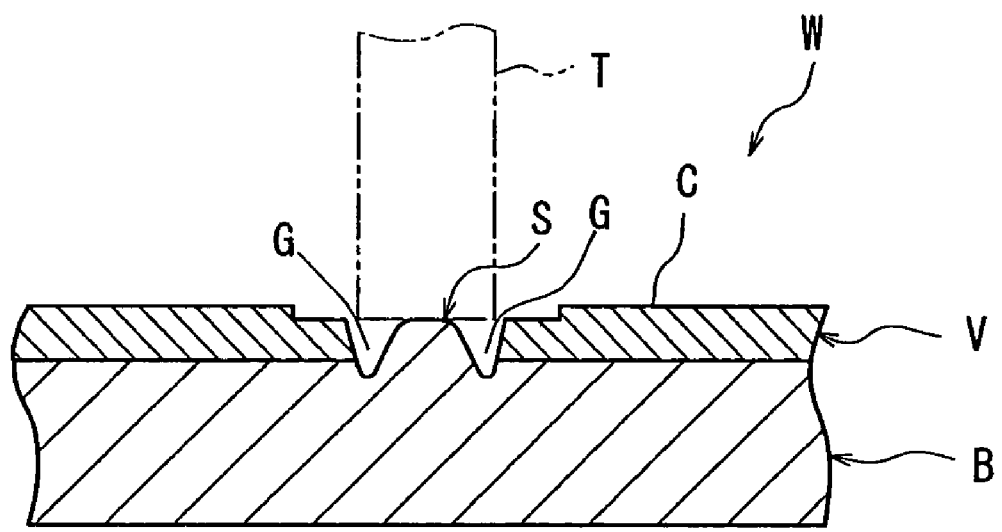
FIG. 16 is an enlarged sectional view of grooves formed in the semiconductor wafer by the laser beam processing machine of the prior art.

After the chuck table 161, that is, the semiconductor wafer 10 is thus moved to the cutting start position of the area to be cut, the cutting blade 162 is moved down from its standby position shown by a two-dotted chain line in FIG. 13 to a predetermined cutting-in feed position shown by a solid line in FIG. 15. This cutting-in feed position is set to a position where the lower end of the cutting blade 162 reaches the protective tape 9 affixed to the back surface of the semiconductor wafer 10, as shown in FIG. 15.

Thereafter, the cutting blade 162 is caused to rotate in the direction indicated by an arrow 162a at a predetermined revolution as shown in FIG. 13, and the chuck table 161, that is, the semiconductor wafer 10 is moved in the direction indicated by the arrow X1 in FIG. 13 at a predetermined cutting-feed rate. When the other end (right end in FIG. 13) of the chuck table 161, that is, the semiconductor wafer 10 reaches a position on the left side by a predetermined distance from right below the cutting blade 162, the movement of the chuck table 161, that is, the semiconductor wafer 10 is stopped. Thus, the semiconductor wafer 10 is cut along the street 14 by cutting-feeding the chuck table 161, that is, the semiconductor wafer 10. The laminate 12 remaining between the first groove 101 and the second groove 102 is cut away with the cutting blade 52 at this time. In this case, as both sides of the laminate 12 are separated from the semiconductor chips 13 by the first groove 101 and the second groove 102, even if the laminate 21 peels off, it does not affect the semiconductor chips 13 (devices). Further, since the outer side walls of the first groove 101 and the second groove 102 are formed perpendicular to the processing surface (top surface) of the laminate 12 as described above, the cutting blade 162 does not affect the laminate 12 on both sides of the street 14.

The chuck table 161, that is, the semiconductor wafer 10 is indexing-fed by a distance corresponding to the interval between streets 14 in the direction (indexing-feed step) perpendicular to the sheet to position the street 14 to be cut next at a location corresponding to the cutting blade 162, thereby returning to the state shown in FIG. 13. The cutting step is carried out in the same manner as described above.

The above cutting step is carried out under the following processing conditions, for example.

Cutting blade: outer diameter of 52 mm, thickness of 20 μm
Revolution of cutting blade: 40,000 rpm
Cutting-feed rate: 50 mm/sec The above-mentioned cutting step is carried out on all the streets 14 formed on the semiconductor wafer 10. As a result, the semiconductor wafer 10 is cut along the streets 14, whereby it is divided into individual semiconductor chips.

What is claimed is:

1. A laser beam processing machine comprising a chuck table for holding a workpiece, a laser beam application means for applying a laser beam to the workpiece held on the chuck table, and a processing-feed means for moving the chuck table and the laser beam application means relative to each other, the laser beam application means including a laser beam oscillation means and a condenser for converging a laser beam oscillated from the laser beam oscillation means and applying the converged laser beam, wherein the condenser comprises a first prism for dividing the laser beam oscillated from the laser beam oscillation means into a first laser beam and a second laser beam both having a semicircular section and interchanging the first laser beam and the second laser beam, a second prism for correcting the optical paths of the first laser beam and the second laser beam formed by the first prism to become parallel to each other, and an image forming lens for forming the first laser beam and the second laser beam whose optical paths have been corrected to be parallel to each other by the second prism, into images of spots having linear portions on the outer sides and arcuate portions on the inner sides.

2. The laser beam processing machine according to claim 1, wherein the interval between the spots of the first laser beam and the second laser beam formed by the image forming lens is controlled by adjusting the interval between the first prism and the second prism.

3. The laser beam processing machine according to claim 1, wherein a relay lens is interposed between the second prism and the image forming lens, and the back-focus position of the relay lens is set to the apex position of the first prism.

4. The laser beam processing machine according to claim 1, wherein a mask member for changing a laser beam having a circular section oscillated from the laser beam oscillation means into a laser beam having a substantially rectangular section is interposed between the laser beam oscillation means and the first prism.

\* \* \* \* \*